United States Patent
Kim et al.

(10) Patent No.: US 9,577,060 B2
(45) Date of Patent: Feb. 21, 2017

(54) PIEZORESISTIVE RESONATOR WITH MULTI-GATE TRANSISTOR

(71) Applicant: Intel Corporation, Santa Clara, CA (US)

(72) Inventors: Raseong Kim, Hillsboro, OR (US); Ian A. Young, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/778,726

(22) PCT Filed: Jun. 29, 2013

(86) PCT No.: PCT/US2013/048791
§ 371 (c)(1),
(2) Date: Sep. 21, 2015

(87) PCT Pub. No.: WO2014/209403
PCT Pub. Date: Dec. 31, 2014

(65) Prior Publication Data
US 2016/0056252 A1    Feb. 25, 2016

(51) Int. Cl.
*H03H 9/24* (2006.01)
*H01L 29/423* (2006.01)
(Continued)

(52) U.S. Cl.
CPC .... *H01L 29/42356* (2013.01); *H01L 27/0886* (2013.01); *H03H 9/02259* (2013.01);
(Continued)

(58) Field of Classification Search
CPC .................. H01L 29/42356; H01L 27/0886
(Continued)

(56) References Cited

U.S. PATENT DOCUMENTS

2008/0079003 A1    4/2008    Shaheen et al.
2010/0164530 A1    7/2010    Hoentschel et al.
(Continued)

FOREIGN PATENT DOCUMENTS

KR    100817949    3/2008
WO    2008044182    4/2008

OTHER PUBLICATIONS

International Searching Authority, "Notification of Transmittal of the International Search Report," mailed Mar. 20, 2014, in International application No. PCT/US2013/048791.
(Continued)

*Primary Examiner* — Jeffrey Shin
(74) *Attorney, Agent, or Firm* — Trop, Pruner & Hu, P.C.

(57) ABSTRACT

An embodiment includes a first nonplanar transistor including a first fin that includes first source and drain nodes, and a first channel between the first source and drain nodes; a second nonplanar transistor including a second fin that includes second source and drain nodes, and a second channel between the second source and drain nodes; a nonplanar gate on the first fin between the first source and drain nodes and on the second fin between the second source and drain nodes; and first insulation included between the gate and the first fin and second insulation between the gate and the second fin; wherein the gate mechanically resonates at a first frequency when at least one of the gate and the first fin is actuated with alternating current (AC) to produce periodic forces on the gate. Other embodiments are described herein.

27 Claims, 8 Drawing Sheets

(51) Int. Cl.
  *H03H 9/02*    (2006.01)
  *H01L 27/088*  (2006.01)
  *H03H 9/17*    (2006.01)

(52) U.S. Cl.
  CPC ............ *H03H 9/17* (2013.01); *H03H 9/2405* (2013.01); *H03H 2009/02314* (2013.01)

(58) Field of Classification Search
  USPC ........................................................ 331/154
  See application file for complete search history.

(56) References Cited

U.S. PATENT DOCUMENTS

2012/0305990 A1     12/2012  Cea et al.
2014/0292429 A1*    10/2014  Manipatruni ............ H03B 5/30
                                                        331/108 C

OTHER PUBLICATIONS

Levitan, et al., "Non-Boolean Associative Architectures Based on Nano-Oscillators" 2012 IEEE, 6 pages, 978-1-4673-0289-0/12.

Weinstein, et al., "The Resonant Body Transistor" 4 pages, pubs.acs.org/NanoLett, Published Feb. 24, 2010, Cornell University, 405 Phillips Hall, Ithaca, New York 14853.

Wang, et al., "An Unreleased MM-Wave Resonant Body Transistor", MEMS 2011, Cancun, Mexico, Jan. 23-27, 2011, 4 pages, 978-1-4244-9634-1/11, IEEE, Massachusetts Institute of Technology, Cambridge, MA.

Taiwan Intellectual Property Office, Office Action mailed Jan. 28, 2016 in Taiwan Patent Application No. 103120504.

* cited by examiner

PIEZORESISTIVE RESONATOR WITH MULTI-GATE TRANSISTOR

TECHNICAL FIELD

Embodiments of the invention are in the field of semiconductor devices and, in particular, micro-electro-mechanical systems (MEMS).

BACKGROUND

An oscillator may include an electric circuit that produces a periodically varying output at a controlled frequency. Filters may be implemented in circuits that selectively pass certain elements of a signal while eliminating other elements of the signal. A resonator may include circuitry that exhibits resonant behavior (i.e., naturally oscillates at resonant frequencies with greater amplitude than at other non-resonant frequencies). Oscillators, filters, resonators and the like may use quartz crystal, inductors, and/or capacitors to generate or promote certain signal frequencies.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Figure 1A:
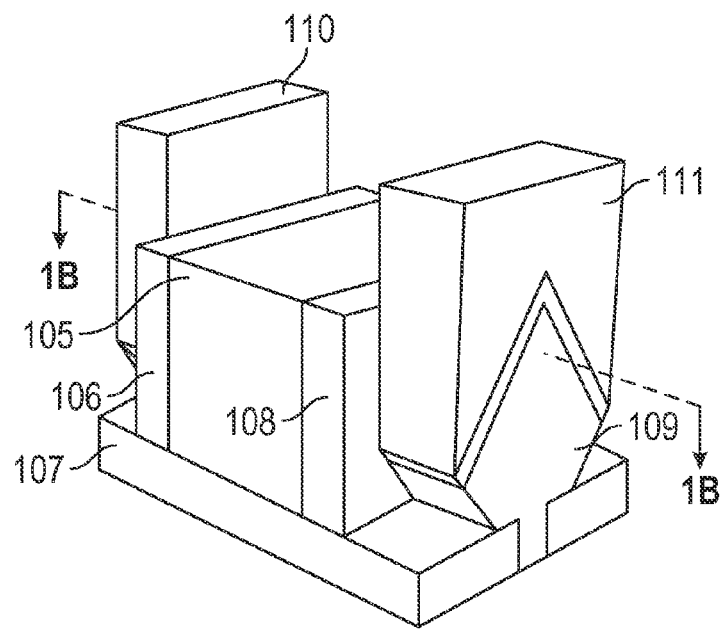
FIG. 1(a) depicts a tri-gate transistor in an embodiment of the invention.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

As mentioned above, conventional oscillators, filters, resonators and the like may use quartz crystal, inductors, and/or capacitors to generate or promote certain signal frequencies. Such components can be expensive, unstable, and/or have too large of a footprint (making them less suitable for inclusion on, for example, a "system on a chip" (SoC) that may include logic circuits as well).

These shortcomings are becoming more critical considering the need for oscillators, filters, and resonators is increasing. For example, the number of frequency bands in a wireless system is growing, and consequently so is the number of required filters. Conventional resonators, such as film bulk acoustic resonators (FBAR), are not integrated with major components of wireless systems, such as complementary metal-oxide-semiconductor (CMOS) radio frequency (RF) transceiver circuits. Due to this non-integration, the circuits require special packaging, which is costly in terms of real estate and finances.

However, embodiments described herein help address these concerns because, for example, such embodiments provide on-chip resonators (e.g., resonators on the same substrate as RF transceiver circuits or on the same substrate as processors) that do not require special packaging. Such embodiments help decrease the resonator footprint, simplify packaging, and lower the cost of producing wireless systems. Furthermore, embodiments are applicable to on-chip clocking. For example, instead of having an off-chip reference for global clocking such an embodiment achieves local clocking with arrays of on-chip oscillators monolithically integrated with the circuits they clock.

Embodiments provide improvements over on-chip resonators that use resonant body transistors (RBT). For example, various mechanical resonators involve non-conventional materials that present problems for silicon substrate based devices. And while silicon based RBTs may be more compatible with Si CMOS processes than those based on non-conventional materials, silicon RBTs still have process compatibility issues with components such as multi-gate fin based transistors. For example, such RBTs have a transistor body (which functions as the resonator) that is too large for modern tri-gate transistors. The RBT body thickness should remain large enough to electrically separate the dual gates these RBTs use and to keep resonant frequencies within a desired range (e.g., 10's of GHz), making it difficult for the RBT to follow modern device scaling trends.

An embodiment includes a PZR. The embodiment is used in an on-chip resonator that utilizes a multi-gate transistor. It does so while taking advantage of a tri-gate transistor's unique features (e.g., multiple, narrow fins connected by a common gate line) and improving the resonator performance. For example, due to high k dielectrics, the embodiment provides larger actuation force for a given bias input, which may result in larger resonator response. Also, tri-gate based embodiments are not limited in scaling the resonator body thickness (i.e., tri-gate based embodiments may use a small resonator body, unlike RBTs discussed above) because the whole gate geometry (not only the transistor body itself such as is the case with RBTs) functions as the resonator, and the resonant frequencies are determined by the PZR device pitch (the distance between "driven" fins, described further below, and not by the body thickness of a single fin as is the case with RBTs). In addition, the driving (which causes resonator mechanical resonance) and sensing (which detects the resonance frequencies) may occur in separate transistors (not within the same transistor powered by dual gates as is the case with RBTs), and this reduces feed-through current issues and improves signal-to-noise ratios for the resonators. The periodic structure along the gate (i.e., multiple fins repeated in a regular pitch) also allows embodiments to tune to different resonant frequencies by changing the period length between the driving and sensing points within the common gate.

Embodiments including PZRs may also help realize non-Boolean computing systems. Nanoscale-oscillators, the building blocks of such computing systems, benefit from the die real estate savings of embodiments described herein so that such systems do not require additional amplifying stages using standard transistors. Therefore, PZRs compatible with tri-gate transistor technology (or more generally, multi-gate transistor technology) with improved performance are more suitable for such nano-oscillators.

An embodiment includes a PZR that combines an acoustic resonator and a field-effect transistor (FET). The PZR operation consists of two modes: (1) capacitive driving, and (2) piezoresistive sensing. In the embodiment both capacitive driving, and piezoresistive sensing are compatible with a tri-gate transistor structure, where multiple fins (or transistors) are connected by a common gate, which is perpendicular to the channel direction of the transistors. For capacitive driving—the resonator is driven by applying DC and AC inputs to the driving transistor, which induces capacitive actuation force across the gate dielectric layers of one or more transistors. As a result of this actuation, the embodiment generates mechanical resonance within the gate, which then functions as an acoustic resonator. For piezoresistive sensing—the resonant frequencies are determined by the PZR device pitch and the material properties (e.g., gate materials). To sense this mechanical vibration, the sensing transistor is biased to flow/transmit a DC MOSFET current, and when the acoustic wave propagates within the gate, the DC MOSFET current is piezoresistively modulated by the dynamic tensile/compressive stress within the fin.

FIG. 1(a) depicts a tri-gate transistor in an embodiment of the invention. Specifically, FIG. 1(a) includes a tri-gate transistor with a source or drain node 109 coupled to a channel (not shown) of a fin, which then couples to a corresponding drain or source node (not shown). Source and drain nodes are connected to contacts 110, 111. Spacers 106, 108 are located between gate 105 and the source/drain nodes, which are on top of substrate 107.

Figure 1B:
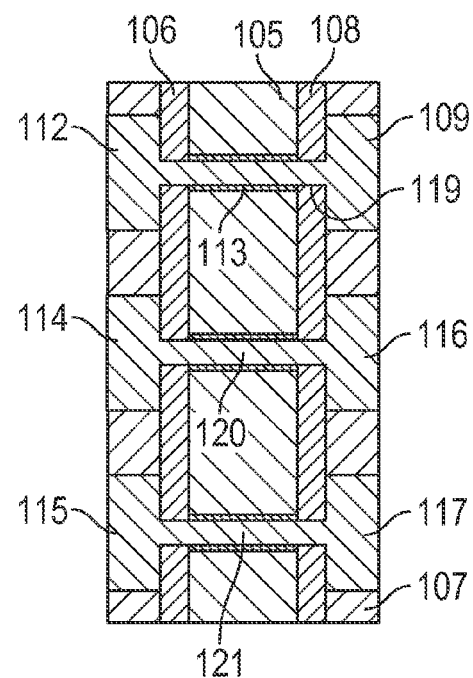
FIG. 1(b) includes a series of tri-gate transistors that collectively form a resonator in an embodiment of the invention.

In greater detail, FIG. 1(a) includes a finFET formed around a thin strip of semiconductor material (referred to as the "fin"). The fin is formed on layer 107. Layer 107 may be a substrate, oxide, and the like. The fin may be formed from the substrate. The transistor includes MOSFET nodes: gate 105, gate dielectric 113 (see FIG. 1(b)), and source and drain regions. The source and drain regions are highly doped (with epitaxial growth in some embodiments). A conductive channel of the finFET resides on the outer sides of the fin beneath the gate dielectric. Current runs along both "sidewalls" of the fin as well as along the top side of the fin. Because the conductive channel essentially resides along the three different outer, planar regions of the fin, the particular finFET of FIG. 1 is typically referred to as a "tri-gate" finFET. Other types of finFETs exist (such as "double-gate" finFETs, which are included in other embodiments and in which the conductive channel principally resides only along both sidewalls of the fin and not along the top side of the fin).

FIG. 1(b) includes a series of tri-gate finFETs that collectively form a resonator in an embodiment of the invention (and while FIG. 1(b) includes three transistors there is no maximum or minimum number of transistors for various embodiments of the invention). Specifically, FIG. 1(b) shows a cross-sectional view of a multi-fin structure on the x-y plane with z at the fin center. FIG. 1(b) includes a tri-gate transistor with a drain node 109 coupled to a channel 119 of a fin, which then couples to a corresponding source node 112. Channel 119 couples to gate dielectric 113 and gate 105. Other transistors include drain nodes 116, 117, channels 120, 121 (all of which couple to gate 105 via separate gate dielectric portions), and source nodes 114, 115.

Figure 2A:
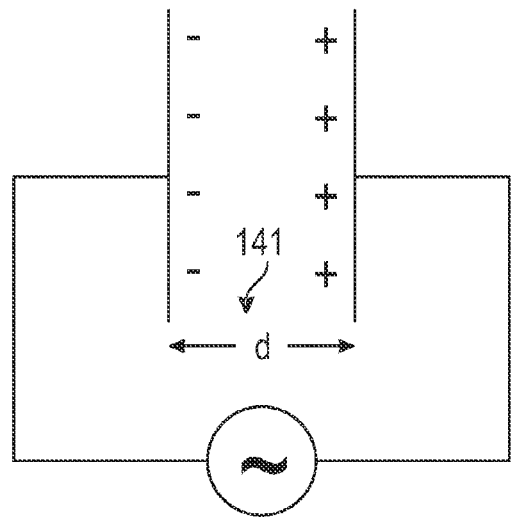
FIG. 2(a) depicts a parallel plate capacitor model for modeling resonator actuation in an embodiment of the invention.

FIG. 2(a) depicts a parallel plate capacitor model for modeling resonator actuation in an embodiment of the invention. The driving and sensing schemes for a PZR (modeled by the capacitor of FIG. 2(a)) include:

$$F_{ac} = \frac{\varepsilon A}{d^2} V_{DC} v_{in}$$

where d, $\varepsilon$, A, $V_{DC}$, and $v_{in}$ respectively correspond to gap thickness, permittivity, capacitor area, DC bias, and AC bias and result in actuation 141 due to actuation force $F_{ac}$.

Figure 2B:
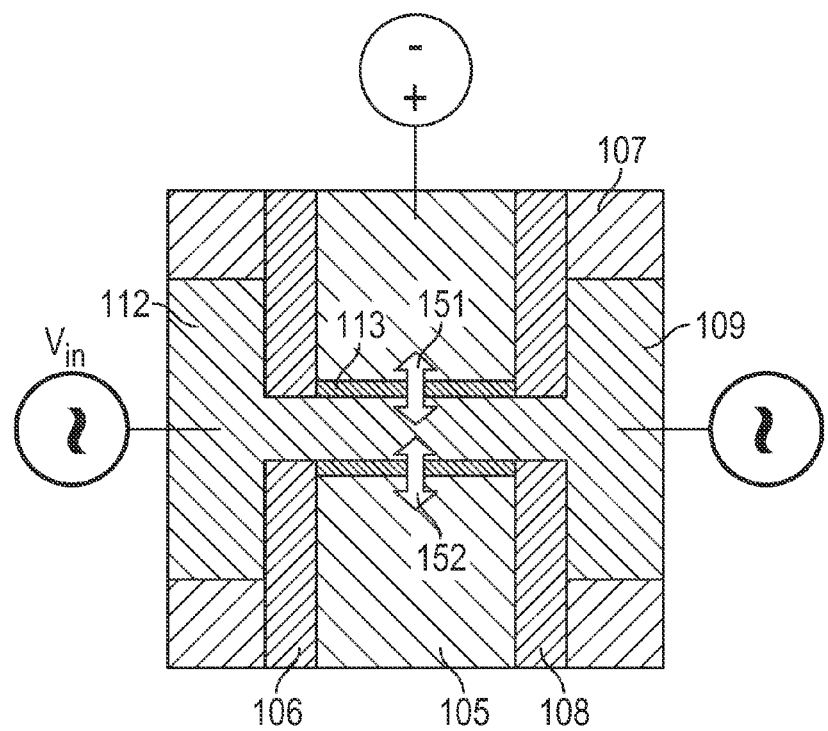
FIG. 2(b) depicts capacitive actuation in an embodiment of the invention.

FIG. 2(b) depicts capacitive actuation 151, 152 in an embodiment of the invention. $V_{DD}$ is supplied to gate 105 and AC is input at source 112/drain 109 to induce capacitive actuation 151, 152 across gate dielectric 113. The high-k dielectric 113 helps provide a larger $F_{ac}$ for the same bias inputs. The $V_{DD}$ DC input is used to create capacitance across the fin and dielectric 113.

Figure 2C:
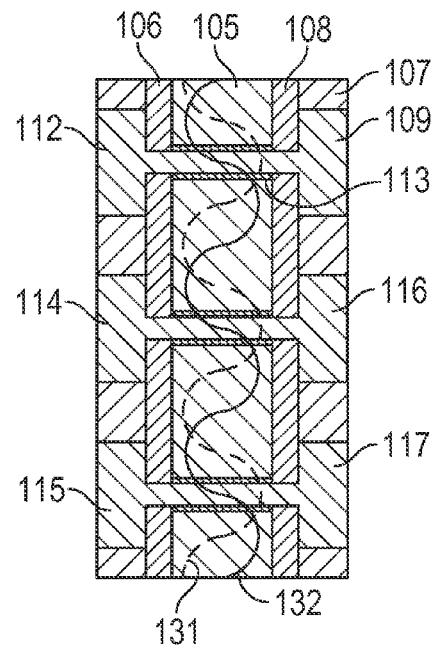
FIG. 2(c) depicts mechanical resonance within a gate of a multiple tri-gate resonator in an embodiment of the invention.

FIG. 2(c) depicts mechanical resonance within gate 105 of a multi tri-gate resonator in an embodiment of the invention. As a result of the actuation (see FIG. 2(b)), mechanical resonance (line 132 corresponds to longitudinal displacement of gate 105 and line 131 corresponds to dynamic stress within gate 105) occurs within gate 105.

Figure 2D:
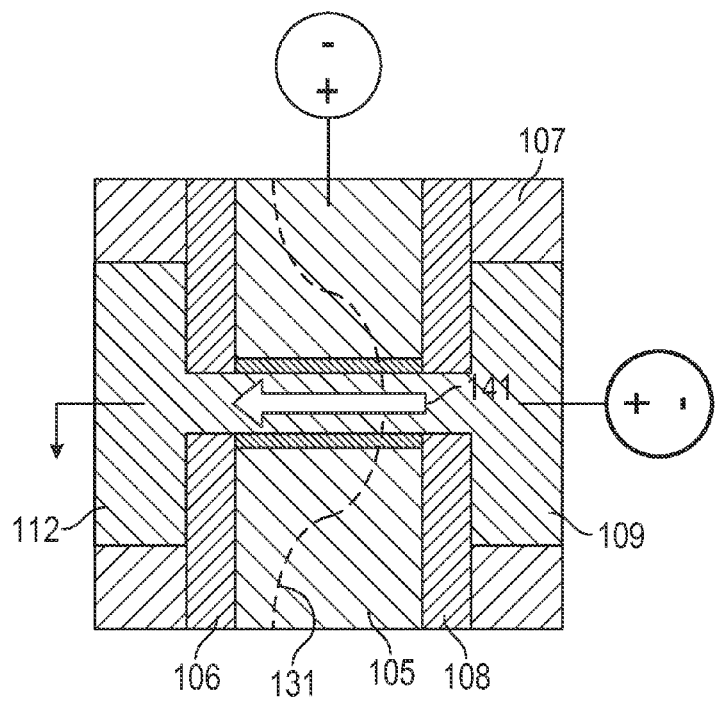
FIG. 2(d) depicts piezoresistive sensing in a piezoresistive resonator (PZR) in an embodiment of the invention.

FIG. 2(d) depicts piezoresistive sensing in a PZR in an embodiment of the invention. To sense periodic stress 131, gate 105 is biased with $V_{DD}$ (to help provide capacitance and generate an inversion layer for the channels that couple sources/drains to one another) and a DC bias is applied to drain 109 to flow MOSFET current 141 through a fin. When gate 105 resonates, DC current 141 is piezoresistively modulated by the dynamic tensile/compressive stress 131 within the fin.

Figure 3A:
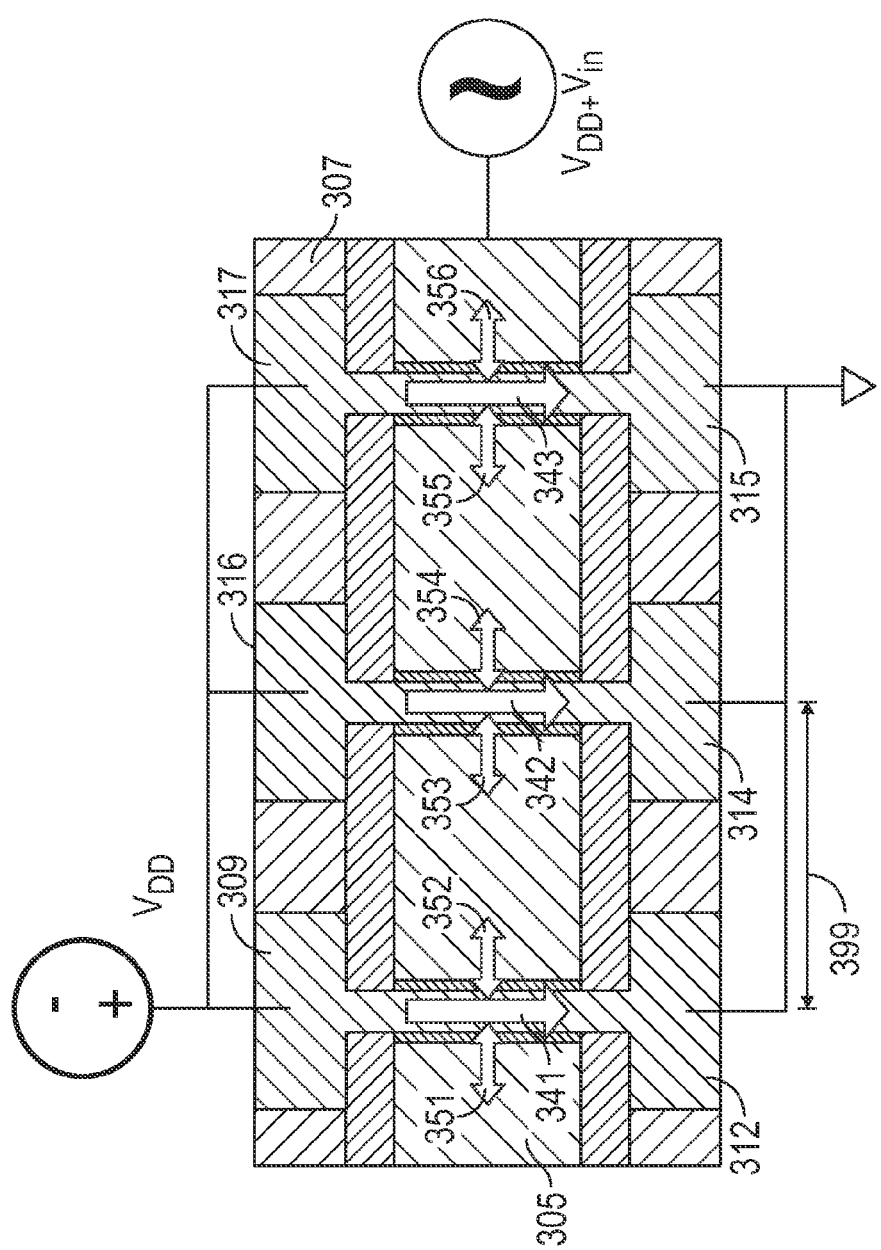
FIGS. 3(a)-(c) include a PZR along with corresponding stress, frequency, and resistance characteristics for that PZR in an embodiment of the invention.
Figure 3B:
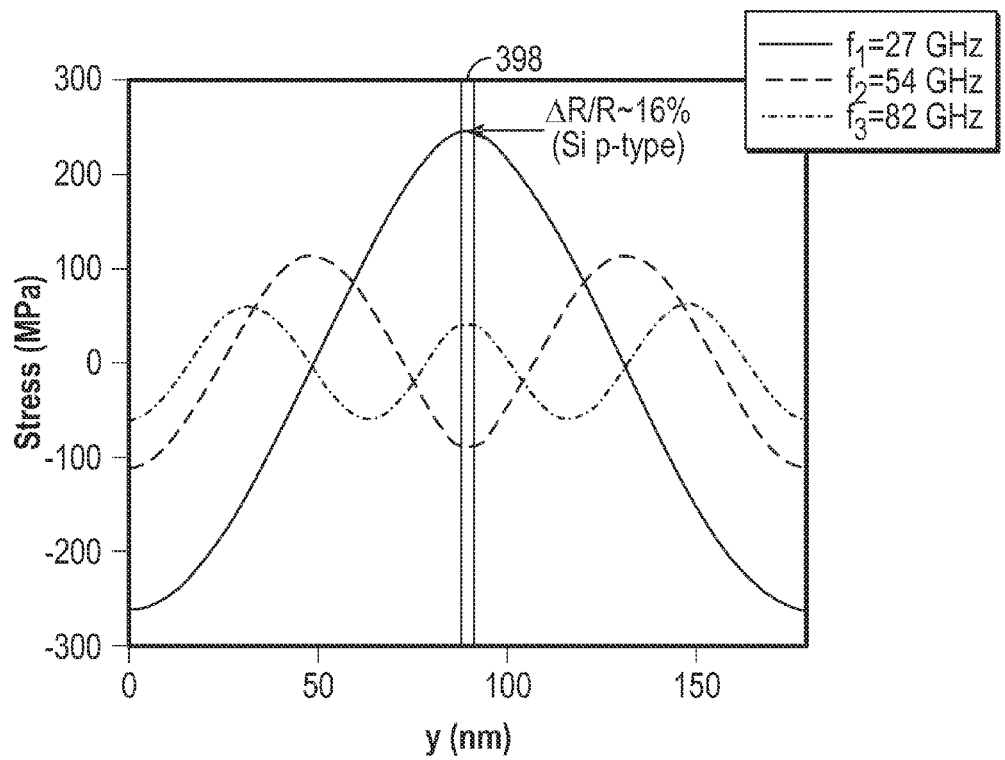
Figure 3C:
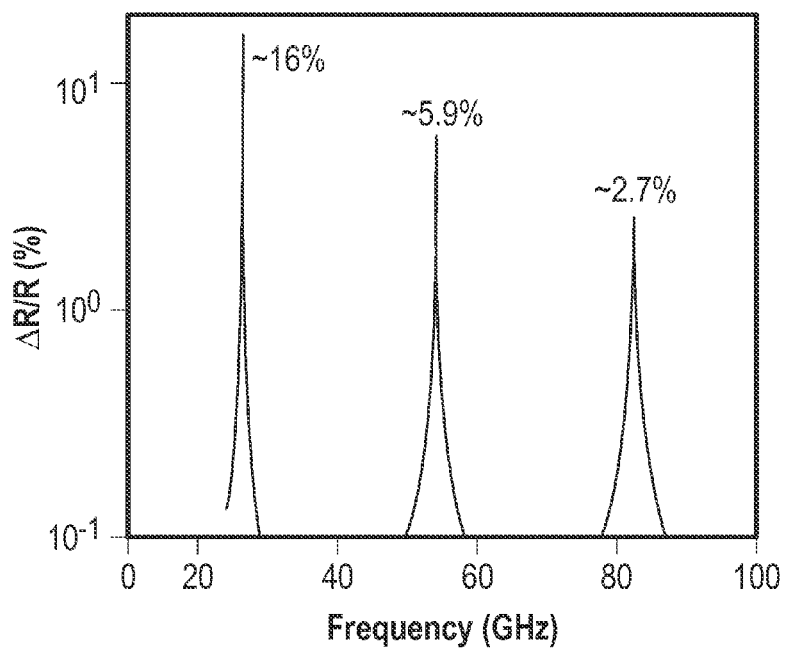
Figure 3D:
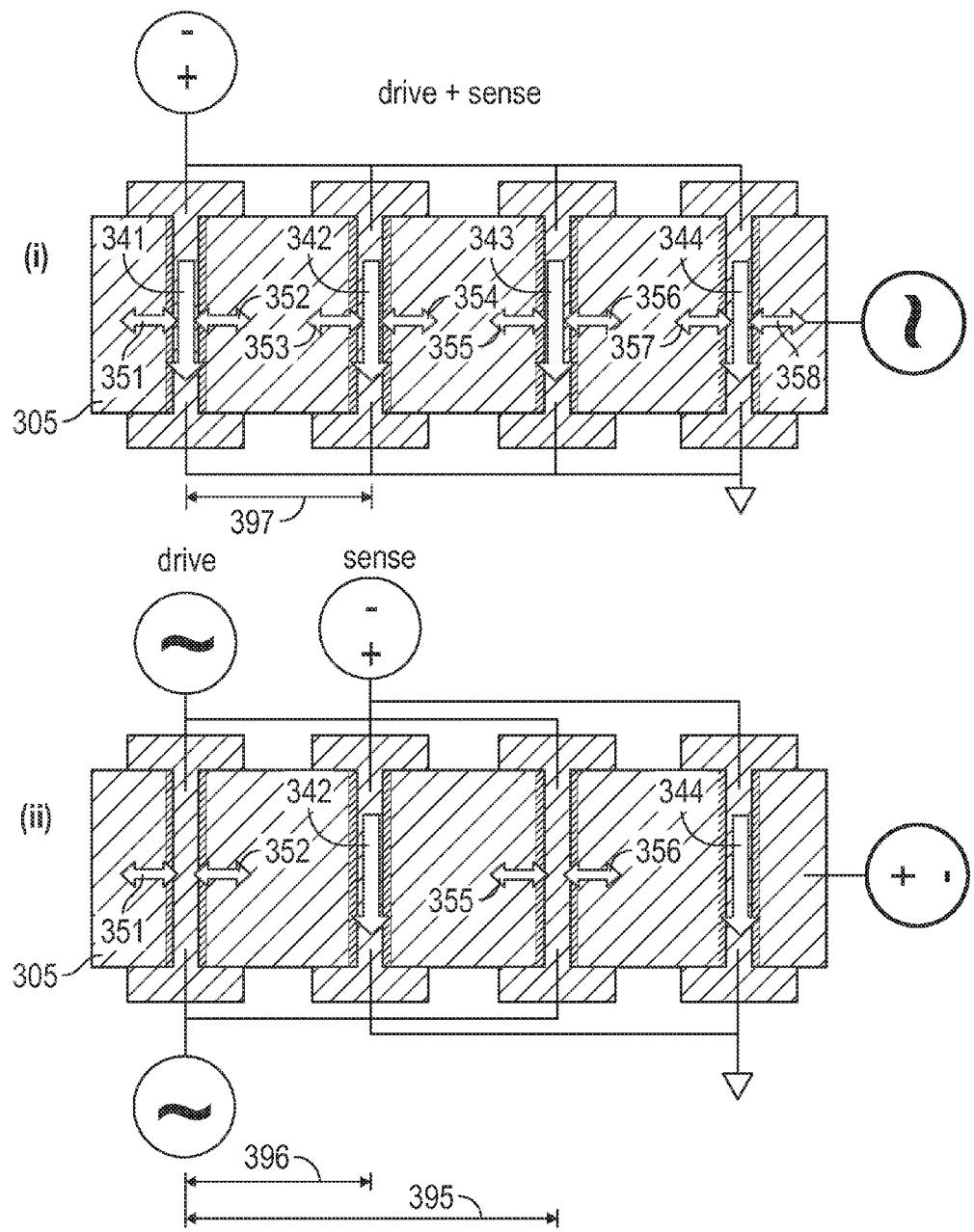
FIGS. 3(d)-(f) include a PZR performing in multiple operation modes, along with corresponding stress, frequency, and resistance characteristics for that PZR in an embodiment of the invention.
Figure 3E:
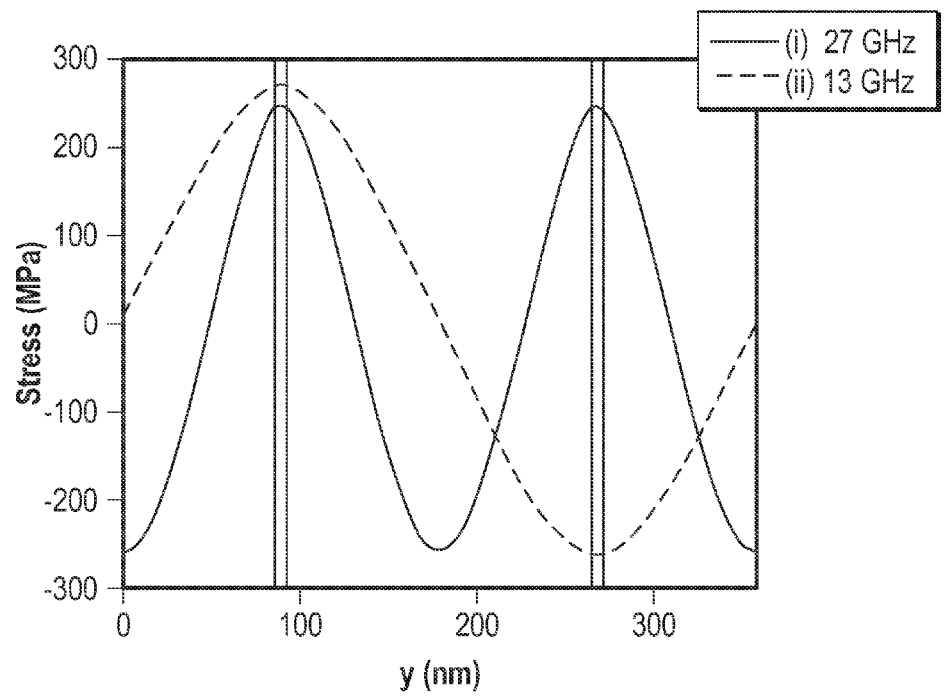
Figure 3F:
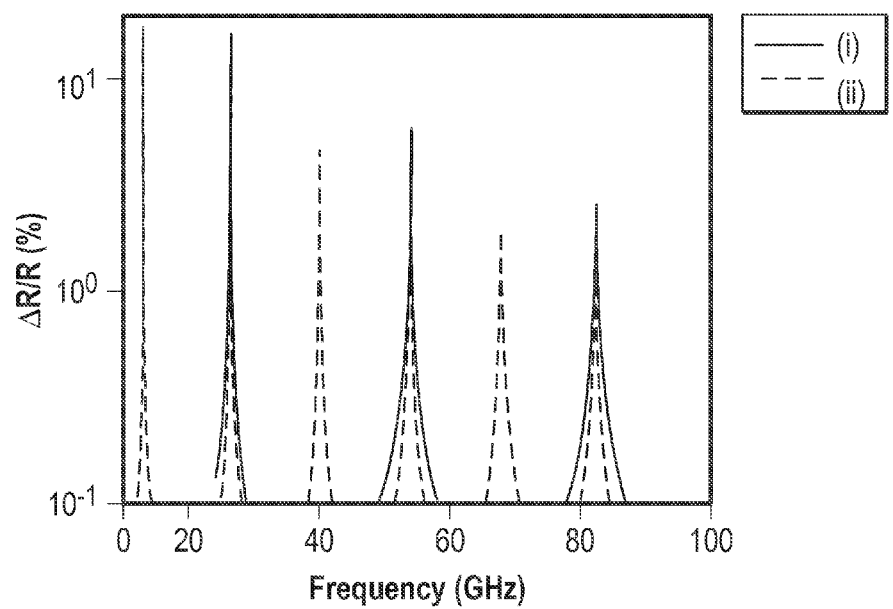

FIGS. 3(a)-(c) include a PZR along with corresponding stress, frequency, and resistance characteristics in an embodiment of the invention. FIGS. 3(d)-(f) include a PZR and multiple operation modes for the PZR, along with corresponding stress, frequency, and resistance characteristics in an embodiment of the invention.

More specifically, FIG. 3(a) describes a 1 dimensional (1D) model of a resonator where the fins are assumed to be very tall (e.g., height of fin divided by its width is greater than 3.0 and includes ratios such as 3.5, 4.0, 4.5, 5.0, 5.5, 6.0 and the like in various embodiments). FIG. 3(a) also shows the bias conditions for the graphs of FIGS. 3(b)-(c).

For actuation, $V_{DD}$ is supplied to the drain components 309, 316, 317 during gate actuation 351, 352, 353, 354, 355, 356 (but in other embodiments $V_{DD}$ may be supplied to source components). Also, to generate gate actuation 351, 352, 353, 354, 355, 356 $v_{in}$ AC is supplied to gate 305, along with $V_{DD}$ ($V_{DD}$ generates an inversion layer for the channel and also provides capacitance about the gate dielectric). This $v_{in}$ (e.g., 10 to 100 mV) and $V_{DD}$ (e.g., 0.7 to 1.2 V, depending on gate oxide thickness) excites the mechanical modes of the device. More specifically, the applied time varying voltage (DC+AC) on the gate produces a time varying force on the channel material, which leads to acoustic resonance of the gate, putting an AC strain on the channel section/fin.

For sensing, $V_{DD}$ (0.7 to 1.2V) 341, 342, 343 is supplied to the source/drain components 309/312, 316/314, 317/315 and $V_{DD}$ (e.g., 0.7 to 1.2 V) is supplied to gate 305 to again generate an inversion layer for the channel and also provide channel inversion capacitance about the gate dielectric.

FIG. 3(b) shows results for the FIG. 3(a) actuation induced stress distribution in gate 305. The results are for first, second, and third modes (i.e., a fundamental "first mode" frequency for the first mode along with second and third harmonic frequencies of the fundamental frequency for the second and third modes) of the resonator device of FIG. 3(a), where the fin to fin pitch is 180 nm (measured as the distance between two adjacent fin channels) 399, the fins are silicon fins, and gate 305 is a tungsten gate (but other embodiments are not so limited). The f-Q product is $2 \times 10^{13}$ Hz with f and Q being the frequency and quality factor for the resonator device, respectively. In FIG. 3(b) the stress is maximized at the fin (one of which is designated with the vertical bar 398 at about 90 nm on the y axis) resulting in a maximum piezoresistive signal detected by current 341 (or current 342, 343). In other words, for the fundamental frequency $f_1=27$ GHz the maximum stress of about 250 MPa is present at the fin, such as the fin described by 309, 312 or any other fin along the gate of the resonator. The second mode ($f_2=54$ GHz—the second harmonic of f1) has a maximum stress of about 100 MPa and the third mode ($f_3=82$ GHz—the third harmonic of f1) has a maximum stress of about 75 MPa.

In FIG. 3(c), for silicon p-type parameters, the relative change of resistance $\Delta R/R$ for the first mode is about 16%, which is significantly larger than those of RBTs with similar f-Q product values (which allows for easier detection of the resonant frequency). The $\Delta R/R$ for the second mode is about 5.9% and the $\Delta R/R$ for the third mode is about 2.7%.

FIG. 3(d) describes two operation schemes for a PZR in an embodiment. In case (i), as also discussed with regard to FIG. 3(a), all the fins are actuated when $V_{DD}$ is supplied to the source/drain components during gate dielectric actuation 351, 352, 353, 354, 355, 356, 357, 358. Also, to generate the gate actuation $v_{in}$ AC is supplied to gate 305, along with $V_{DD}$. For sensing, current from $V_{DD}$ 341, 342, 343, 344 is supplied to the drain components and 0 V to the source components. $V_{DD}$ and $v_{in}$ AC is supplied to gate 305. In this embodiment each of the fins is used for both driving and sensing. The PZR device pitch (distance between fins that are actively driven with current during actuation, the distance being measured "mid fin" to "mid fin") 397, which determines the resonant frequencies, is the same as the fin pitch (but this is not always the case as is described below).

In case (ii) of FIG. 3(d), the dielectric actuation is skipped at every other fin (i.e., only half of the fins are used for actuation while the other half of fins are only used for sensing). This alternating of fins doubles the PZR device pitch 395 to twice that of the fin pitch 396. Thus, while fin pitch may only be 180 nm the "PZR device pitch" is twice that amount at 360 nm, which scales the resonant frequencies by a factor of ½. Thus, $f_1$ for operation mode (i) is again 27 GHz (just like FIG. 3(b)) but due to the PZR device pitch change the fundamental $f_1$ frequency for operation mode (ii) is only 13 GHz (½ of 27 GHz). The approach can be extended to achieve scaling factors of ⅓, ¼, and the like. Another advantage of operation mode (ii) is that since drive and sense fins are separated, there is reduced feed-through current to the sense fins, which improves signal to noise ratio for the PZR.

FIG. 3(e) shows stress distribution and frequency sweeps for cases (i) and (ii) of FIG. 3(d). By doubling the length of the period (i.e., operation mode (ii)), resonant modes are obtained that are not available for the single period case. For FIG. 3(e) again a maximum stress is at the fin located at about 90 nm on the y axis for operation mode (i). However for operation mode (ii) the maximum stress shifts locations in correspondence to its lower frequency. In other words, in an embodiment the maximum stress for mode (ii) is located at each of the fins except the maximum stress alternates+ (first vertical bar at about 90 nm) to −(other vertical bar) maximum stress. The maximum positive stress only occurs at the driven fins. More specifically, the maximum stress basically means maximum "magnitude" of stress when dealing with dynamic stress. For the two vertical bars in FIG. 3e (that correspond to fins with the left bar/right bar assumed to respectively be the drive fin/sense fin for the double pitch case (dashed curve)), both fins experience the maximum stress but each with opposite phase (drive fin has positive maximum stress and sense fin has negative maximum stress). At some other time point, the phase may be reversed and the drive fin may experience the negative maximum stress with the sense fin experiencing the positive maximum stress.

FIG. 3(f) shows twice the $\Delta R/R$ peaks as compared to the higher frequency associated with operation mode (i). This occurs because the frequency axis is the same but the resonance occurs at a lower frequency. Therefore, there are more peaks over the same x-axis range of frequency.

Thus, an embodiment provides a less expensive, stable, and small resonant on-chip device suitable for monolithic integration in SoCs that include radiofrequency (RF) and/or wireless components such as oscillators, filters, and other components that require resonator elements. The embodiment includes a mechanically resonant tri-gate or finFET based resonator formed with multiple fins per gate. Periodically exciting the gate dielectric regions will cause periodic coulombic forces that deflect the gate material in a periodic fashion. Thus, periodically exciting the gate forms a resonant device, such as an oscillator. An embodiment enables a PZR using a CMOS compatible tri-gate or multi-gate process. Embodiments with compact scalable PZRs fabricated in CMOS enable a large range of RF low power mobile and wireless components. The compact oscillators realized by nano-mechanical acoustic resonant devices enable non-Boolean architectures for specialized computing (e.g., pattern recognition applications that rely on synchronized resonance of arrays of oscillators).

Thus, embodiments of CMOS based nano-mechanical resonant devices described herein: (1) provide on chip resonant structures (while avoiding or limiting use of inductors and capacitors), (2) enable circuits with a wide frequency operation range (e.g., 1 GHz-100 GHz and spanning several wireless bands), (3) reduce the number of discrete components needed for wireless and RF applications, and/or (4) enable on chip frequency sources for clocking and non-Boolean computing.

Due to the high Q factor provided by materials that form the mechanical acoustic oscillators, the frequency content of the embodiments described herein are stable, have low phase noise, and thereby obviate the need (wholly or partially) for expensive off-chip crystal oscillators for RF circuits (e.g., oscillators, resonators, switches, filters) and/or high speed input/output (I/O) systems. Such embodiments are suitable for, as an example, synchronous logic and microprocessor components requiring inexpensive, highly stable, low jitter, high frequency clock signals in a standard CMOS process. Such embodiments may also be used in, for example, narrowband RF switches or filters at high frequency.

An embodiment includes fins of varying lengths to provide tunable/multi-mode oscillators with select/switched resonator features. Different PZR pitch arrangements may also provide for tunable resonators. For example, a multiplexor may be used to vary the sense nodes and the actuating nodes discussed in FIG. 3(d)(ii). For example, in a first orientation every fin may be used for actuation, in a second orientation every other fin may be used for actuation, and in a third orientation every third fin may be used for actuation—all resulting in a user-selectable range of tunable resonant frequencies. This produces PZRs having different resonant frequencies. Various PZRs may be combined together to create re-configurable oscillators that oscillate at different frequencies, where the oscillator of a non-desired frequency can be easily switched on or off via switches coupled to the source/drains of tri-gate FETs in the PZRs. By using different combinations of PZRs, an embodiment provides frequency tuning capabilities.

At times, the gate is symmetrically formed about the fin(s) and provides symmetrical sidewall forces for resonance. In other words, the forces applied to the side walls of the fin(s) are symmetric because the gate is disposed symmetrically along the sides of the fin(s). However, in other embodiments the gate may not be so disposed and may instead be asymmetrically formed on the fin(s) sidewalls and consequently provide asymmetric forces that may cause the fin(s) to resonate in-plane, out-of-plane, or in a hybrid fashion between in-plane and out-of-plane resonance.

Various embodiments described herein use PZRs that provide high-Q, on-chip resonators compatible with multigate (e.g., tri-gate) transistor process technology. Such on-chip resonators are used for 10's of GHz RF filters and oscillators and/or novel computing systems such as the pattern recognition by synchronization of coupled nano-oscillators (i.e., non-Boolean computing). Consequently, PZRs provide improvements over RF filters realized by FBARs, which are off-chip elements that require special packaging. Further, embodiments provide improvements over coupled nano-oscillators for non-Boolean computing that include RBTs and/or resonant body oscillators (RBOs).

Figure 4:
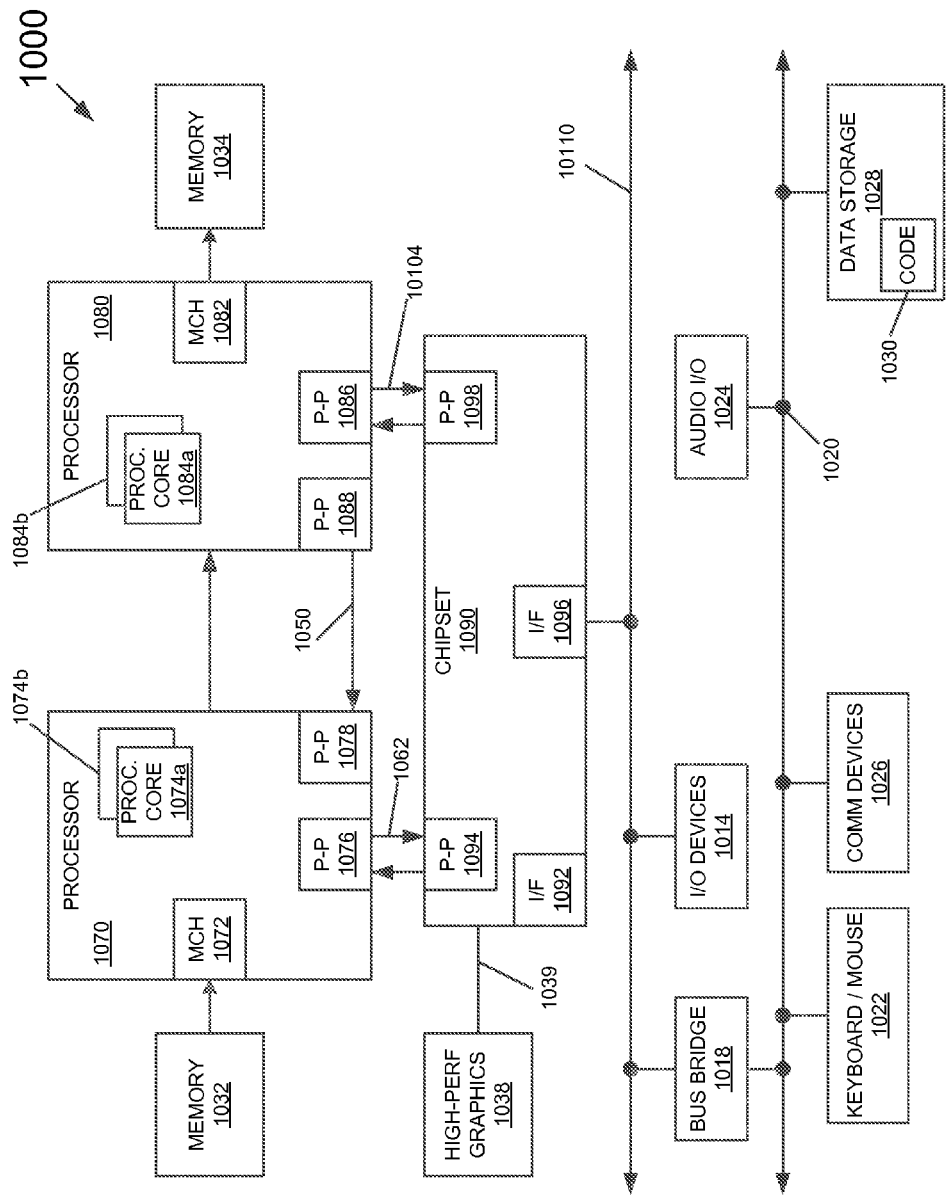
FIG. 4 depicts a system for use with embodiments of the invention.

Embodiments may be used in many different types of systems. For example, in one embodiment a communication device (e.g., cell phone, Smartphone, netbook, notebook, personal computer, watch, and camera) can be arranged to include various embodiments described herein. Referring now to FIG. 4, shown is a block diagram of a system embodiment 1000 in accordance with an embodiment of the present invention. Shown is a multiprocessor system 1000 that includes a first processing element 1070 and a second processing element 1080. While two processing elements 1070 and 1080 are shown, it is to be understood that an embodiment of system 1000 may also include only one such processing element. System 1000 is illustrated as a point-to-point interconnect system, wherein the first processing element 1070 and second processing element 1080 are coupled via a point-to-point interconnect 1050. It should be understood that any or all of the interconnects illustrated may be implemented as a multi-drop bus rather than point-to-point interconnect. As shown, each of processing elements 1070 and 1080 may be multicore processors, including first and second processor cores (i.e., processor cores 1074a and 1074b and processor cores 1084a and 1084b). Such cores 1074a, 1074b, 1084a, 1084b may be configured to execute instruction code in a manner similar to methods discussed herein.

Each processing element 1070, 1080 may include at least one shared cache. The shared cache may store data (e.g., instructions) that are utilized by one or more components of the processor, such as the cores 1074a, 1074b and 1084a, 1084b, respectively. For example, the shared cache may locally cache data stored in a memory 1032, 1034 for faster access by components of the processor. In one or more embodiments, the shared cache may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the present invention is not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, microarchitectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

First processing element 1070 may further include memory controller (MC) logic 1072 and point-to-point (P-P) interfaces 1076 and 1078. Similarly, second processing element 1080 may include a MC 1082 and P-P interfaces 1086 and 1088. MC's 1072 and 1082 couple the processors to respective memories, namely a memory 1032 and a memory 1034, which may be portions of main memory locally attached to the respective processors. While MC logic 1072 and 1082 is illustrated as integrated into the processing elements 1070, 1080, for alternative embodiments the MC logic may be discrete logic outside the processing elements 1070, 1080 rather than integrated therein.

First processing element 1070 and second processing element 1080 may be coupled to an I/O subsystem 1090 via P-P interfaces 1076, 1086 via P-P interconnects 1062, 10104, respectively. As shown, I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, a bus may be used to couple graphics engine 1038 to I/O subsystem 1090. Alternately, a point-to-point interconnect 1039 may couple these components.

In turn, I/O subsystem 1090 may be coupled to a first bus 10110 via an interface 1096. In one embodiment, first bus 10110 may be a Peripheral Component Interconnect (PCI) bus, or a bus such as a PCI Express bus or another third generation I/O interconnect bus, although the scope of the present invention is not so limited.

As shown, various I/O devices 1014, 1024 may be coupled to first bus 10110, along with a bus bridge 1018 which may couple first bus 10110 to a second bus 1020. In one embodiment, second bus 1020 may be a low pin count (LPC) bus. Various devices may be coupled to second bus 1020 including, for example, a keyboard/mouse 1022, communication device(s) 1026 (which may in turn be in communication with a computer network), and a data storage unit 1028 such as a disk drive or other mass storage device which may include code 1030, in one embodiment. The code 1030 may include instructions for performing embodiments of one or more of the methods described above. Further, an audio I/O 1024 may be coupled to second bus 1020.

Note that other embodiments are contemplated. For example, instead of the point-to-point architecture shown, a system may implement a multi-drop bus or another such communication topology. Also, the elements of the FIG. 4 may alternatively be partitioned using more or fewer integrated chips than shown in the FIG. 4.

One or more PZRs described herein may be used in, for example, one or more integrated circuit semiconductor packages including components such as 1070, 1080, 1038, 1090, signal processors, graphics processors, wireless baseband processors, or a combination of these components.

Example 1 includes a resonator system comprising: a first nonplanar transistor including a first fin that includes first source and drain nodes, and a first channel between the first source and drain nodes; a second nonplanar transistor including a second fin that includes second source and drain nodes, and a second channel between the second source and drain nodes; a nonplanar gate on the first fin between the first source and drain nodes and on the second fin between the second source and drain nodes; wherein (a) the gate mechanically resonates at a first frequency when at least one of the gate and the first fin is actuated with alternating current (AC) to produce periodic forces on the gate, and (b) the first and second fins are not coupled to any other gate between the first source and drain nodes.

The nonplanar transistors may be multi-gate transistors such as finFETs conducting current along the fin sidewalls and/or top wall. A nonplanar gate "on" the first fin between the first source and drain nodes does not mean directly connected as, in an embodiment, dielectric is included between the gate and fin.

In another example the subject matter of Example 1 can optionally include wherein the gate mechanically resonates at the first frequency when at least one of the gate and the second fin is periodically actuated with AC to produce periodic forces on the gate.

In another example the subject matter of Example 1 or subsequently mentioned examples can optionally include wherein the first and second fins are adjacent one another and there are no fins under the gate and between the first and second fins.

Such a situation is shown in, for example, FIG. 2(c) with the fins including nodes 109 and 116. By saying "there are no fins under the gate and between the first and second fins"

this includes no fins at the same layer level as the first and second fins and does not necessarily pertain to fins that may or may not be buried many layers below the first and second fins.

In another example the subject matter of Example 1 or subsequently mentioned examples can optionally include wherein the first frequency is determined based on pitch distance between the first and second fins.

In another example the subject matter of Example 1 or subsequently mentioned examples can optionally include the resonator configured to sense the first frequency based on supplying direct current (DC) to the first fin while the gate resonates.

By saying "while" and "when" such terms are similar to "simultaneous" and mean there is some period of overlap between two actions, but those two actions do not have to be in phase with one another and/or start and/or finish at the same time.

In another embodiment instead of measuring the change of source/drain current (which requires DC), the embodiment measures the capacitive current across the gate dielectric.

In another example the subject matter of Example 1 or subsequently mentioned examples can optionally include wherein the DC is modulated based on periodic stress within the first fin that is induced by the AC.

In another example the subject matter of Example 1 or subsequently mentioned examples can optionally include a third nonplanar transistor including a third fin, which includes third source and drain nodes, and a third channel between the third source and drain nodes, the gate being on the third fin and between the third source and drain nodes; wherein the gate mechanically resonates at the first frequency when at least one of the gate and the third fin is periodically actuated with AC to produce periodic forces on the gate.

In another example the subject matter of Example 1 or subsequently mentioned examples can optionally include wherein the second fin is between the first and third fins.

In another example the subject matter of Example 1 or subsequently mentioned examples can optionally include wherein the resonator is configured to sense the first frequency based on supplying direct current (DC) to the second fin, but not the first and third fins, while the gate resonates. Such a situation is shown in, for example, FIG. 3(d)(ii).

In another example the subject matter of Example 1 or subsequently mentioned examples can optionally include wherein the first frequency is determined based on pitch distance between the first and third fins.

In another example the subject matter of Example 1 or subsequently mentioned examples can optionally include the resonator included in a monolithic substrate that also includes a controller. Such a controller may include a signal processor, such as a graphics processor, wireless baseband processor, and the like.

In another example the subject matter of Example 1 or subsequently mentioned examples can optionally include wherein the resonator does not include an inductor and is included in at least one of a filter and an oscillator.

In another example the subject matter of Example 1 or subsequently mentioned examples can optionally include wherein the gate includes a long axis perpendicular to long axes of the first and second fins.

In another example the subject matter of Example 1 or subsequently mentioned examples can optionally include wherein the gate resonates with longitudinal deflections parallel to the long axis. Such a longitudinal deflection is shown in, for example, line 132 where the gate deflects in a direction orthogonal to the fin channels.

In another example the subject matter of Example 1 or subsequently mentioned examples can optionally include wherein when the gate mechanically resonates at the first frequency a maximum stress is located at the first fin and not between the first and second fins.

In another example the subject matter of Example 1 or subsequently mentioned examples can optionally include the resonator coupled to a multiplexor including first and second operating modes, wherein the first mode supplies the AC to the first fin but not the second fin, and the second mode supplies the AC to the first and second fins.

In another example the subject matter of Example 1 or subsequently mentioned examples can optionally include wherein the gate mechanically resonates at the first frequency when the at least one of the gate and the first fin is actuated with AC while simultaneously the gate is supplied with direct current (DC).

An additional example includes a system on a chip (SoC) comprising: first and second nonplanar transistors including first and second fins; a nonplanar gate on the first and second fins; and a controller formed in a monolithic substrate that also includes the first and second fins; wherein (a) the gate resonates at a first frequency when at least one of the gate and the first fin is actuated with alternating current (AC), and (b) the first and second fins are not coupled to any other gate between the first source and drain nodes.

In another example the subject matter of the "additional example" can optionally include wherein the gate resonates at the first frequency when at least one of the gate and the second fin is actuated with AC.

In another example the subject matter of the "additional example" or subsequently mentioned examples can optionally include wherein the first frequency is determined based on pitch distance between the first and second fins.

In another example the subject matter of the "additional example" or subsequently mentioned examples can optionally include the SoC configured to sense the first frequency based on supplying direct current (DC) to the first fin while the gate resonates.

Yet another example includes a method comprising: providing a system on a chip (SoC) having first and second nonplanar transistors including first and second fins; a nonplanar gate on the first and second fins; and a controller formed in a monolithic substrate that also includes the first and second fins; and actuating at least one of the gate and the first fin with alternating current (AC) to induce resonation in the gate at a first frequency; wherein the first and second fins are not coupled to any other gate between the first source and drain nodes.

In another example the subject matter of the "yet another example" can optionally include supplying direct current (DC) to the first fin while the gate resonates; modulating the DC based on periodic stress within the first fin that is induced by the AC; and sensing the first frequency based on the modulated DC.

Still another example includes a resonator system comprising: a first nonplanar transistor including a first fin that includes first source and drain nodes, and a first channel between the first source and drain nodes; a second nonplanar transistor including a second fin that includes second source and drain nodes, and a second channel between the second source and drain nodes; and a nonplanar gate on the first fin between the first source and drain nodes and on the second fin between the second source and drain nodes; a direct current (DC) contact, to receive a DC current, coupled to the gate and further coupled to at least one of the first and second fins; and an alternating current (AC) contact, to receive an AC current, coupled to at least one of the gate, the first fin, and the second fin; wherein the first and second fins are not coupled to any other gate between the first source and drain nodes.

In another example the subject matter of the "still another example" can optionally include wherein the DC contact couples to the first fin and the AC contact couples to the gate.

In another example the subject matter of the "still another example" can optionally include wherein the gate mechanically resonates at a first frequency when the gate is actuated with the AC current, from the AC contact, to produce periodic forces on the gate.

In another example the subject matter of the "still another example" can optionally be configured to sense the first frequency based on supplying the DC current, from the DC contact, to the first fin while the gate resonates.

In another example the subject matter of the "still another example" can optionally include wherein the DC and AC contacts each couple to the first fin.

In another example the subject matter of the "still another example" can optionally include wherein the DC contact couples to the first and second fins and the AC contact couples to the gate.

In another example the subject matter of the "still another example" can optionally include wherein the DC contact couples to the second fin and the AC contact couples to the first fin.

In another example the subject matter of the "still another example" can optionally include AC and DC sources that respectively couple to the AC and DC contacts to provide the AC and DC currents.

As described above in the "still another example" there are many different biasing arrangements. For example, during actuation AC is provided to one of the gate and/or a fin or fins. During actuation DC is supplied to the gate and during sensing the DC (or another version of DC) is applied to a fin. During sensing DC is applied to the gate. In an embodiment for actuation Gate=DC and Fin1=AC and for sensing Gate=DC and Fin1=DC. In an embodiment for actuation Gate=DC+AC and Fin1=DC and for sensing Gate=DC and Fin1=DC. In an embodiment for actuation Gate=DC+AC and Fin1=DC and for sensing Gate=DC+AC and Fin1=DC. In an embodiment for actuation Gate=DC+AC and Fin1=DC and for sensing Gate=DC+AC and Fin1=0 and Fin2 (adjacent Fin1)=DC. In an embodiment for actuation Gate=DC and Fin1=AC and for sensing Gate=DC and Fin1=0 and Fin2 (adjacent Fin1)=DC. Other biasing combinations are included in other embodiments.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A resonator system comprising:
   a first nonplanar transistor including a first fin that includes first source and drain nodes, and a first channel between the first source and drain nodes;
   a second nonplanar transistor including a second fin that includes second source and drain nodes, and a second channel between the second source and drain nodes; and
   a nonplanar gate on the first fin between the first source and drain nodes and on the second fin between the second source and drain nodes;
   a direct current (DC) contact, to receive a DC current, coupled to the gate and further coupled to at least one of the first and second fins; and
   an alternating current (AC) contact, to receive an AC current, coupled to at least one of the gate, the first fin, and the second fin;
   wherein the first and second fins are not coupled to any other gate between the first source and drain nodes.

2. The system of claim 1, wherein the DC contact couples to the first fin and the AC contact couples to the gate.

3. The system of claim 2, wherein the gate mechanically resonates at a first frequency when the gate is actuated with the AC current, from the AC contact, to produce periodic forces on the gate.

4. The system of claim 3 configured to sense the first frequency based on supplying the DC current, from the DC contact, to the first fin while the gate resonates.

5. The system of claim 1, wherein the DC and AC contacts each couple to the first fin.

6. The system of claim 1, wherein 1 the DC contact couples to the first and second fins and the AC contact couples to the gate.

7. The system of claim 1, wherein the DC contact couples to the second fin and the AC contact couples to the first fin.

8. The system of claim 1 comprising AC and DC sources that respectively couple to the AC and DC contacts to provide the AC and DC currents.

9. A resonator system comprising:
   a first nonplanar transistor including a first fin that includes first source and drain nodes, and a first channel between the first source and drain nodes;
   a second nonplanar transistor including a second fin that includes second source and drain nodes, and a second channel between the second source and drain nodes; and
   a nonplanar gate on the first fin between the first source and drain nodes and on the second fin between the second source and drain nodes;
   wherein (a) the gate mechanically resonates at a first frequency when at least one of the gate and the first fin is actuated with alternating current (AC) to produce periodic forces on the gate, and (b) the first and second fins are not coupled to any other gate between the first source and drain nodes.

10. The system of claim 9, wherein the first and second fins are adjacent one another and there are no fins under the gate and between the first and second fins.

11. The system of claim 9, wherein the first frequency is determined based on pitch distance between the first and second fins.

12. The system of claim 9 configured to sense the first frequency based on supplying direct current (DC) to the first fin while the gate resonates; wherein the DC is modulated based on periodic stress within the first fin that is induced by the AC.

13. The system of claim 9 comprising:
   a third nonplanar transistor including a third fin, which includes third source and drain nodes, and a third channel between the third source and drain nodes, the gate being on the third fin and between the third source and drain nodes;
   wherein the gate mechanically resonates at the first frequency when at least one of the gate and the third fin is periodically actuated with the AC to produce periodic forces on the gate.

14. The system of claim 13, wherein the second fin is between the first and third fins and the system is configured to sense the first frequency based on supplying direct current (DC) to the second fin, but not the first and third fins, while the gate resonates.

15. The system of claim 13, wherein the first frequency is determined based on pitch distance between the first and third fins.

16. The system of claim 9 included in a monolithic substrate that also includes a controller.

17. The system of claim 9 comprising an AC source to supply the AC.

18. The system of claim 9, wherein the gate includes a long axis perpendicular to long axes of the first and second fins and the gate resonates with longitudinal deflections parallel to the long axis.

19. The system of claim 9, wherein when the gate mechanically resonates at the first frequency a maximum stress is located at the first fin and not between the first and second fins.

20. The system of claim 9 coupled to a multiplexor including first and second operating modes, wherein the first mode supplies the AC to the first fin but not the second fin, and the second mode supplies the AC to the first and second fins.

21. The system of claim 9, wherein the gate mechanically resonates at the first frequency when the at least one of the gate and the first fin is actuated with the AC while simultaneously the gate is supplied with direct current (DC).

22. A system on a chip (SoC) comprising:
   first and second nonplanar transistors including first and second fins;
   a nonplanar gate on the first and second fins; and
   a controller formed in a monolithic substrate that also includes the first and second fins;
   wherein (a) the gate resonates at a first frequency when at least one of the gate and the first fin is actuated with alternating current (AC), and (b) the first and second fins are not coupled to any other gate between the first source and drain nodes.

23. The SoC of claim 22, wherein the gate resonates at the first frequency when at least one of the gate and the second fin is actuated with the AC.

24. The SoC of claim 22, wherein the first frequency is determined based on pitch distance between the first and second fins.

25. The SoC of claim 22 configured to sense the first frequency based on supplying direct current (DC) to the first fin while the gate resonates.

26. A method comprising:
providing a system on a chip (SoC) having first and second nonplanar transistors including first and second fins; a nonplanar gate on the first and second fins; and a controller formed in a monolithic substrate that also includes the first and second fins; and
actuating at least one of the gate and the first fin with alternating current (AC) to induce resonation in the gate at a first frequency;
wherein the first and second fins are not coupled to any other gate between the first source and drain nodes.

27. The method of claim 26 comprising:
supplying direct current (DC) to the first fin while the gate resonates;
modulating the DC based on periodic stress within the first fin that is induced by the AC; and
sensing the first frequency based on the modulated DC.

\* \* \* \* \*